United States Patent
Kim et al.

(10) Patent No.: US 11,454,546 B2
(45) Date of Patent: *Sep. 27, 2022

(54) HYBRID VISIBLE/NIR AND LWIR SENSOR WITH RESISTIVE MICROBOLOMETER

(71) Applicant: Samsung Electronics Co., Ltd., Suwon-si (KR)

(72) Inventors: Kwang Oh Kim, Cerritos, CA (US); Yibing Michelle Wang, Temple City, CA (US); Radwanul Hasan Siddique, Pasadena, CA (US)

(73) Assignee: SAMSUNG ELECTRONICS CO., LTD.

( * ) Notice: Subject to any disclaimer, the term of this patent is extended or adjusted under 35 U.S.C. 154(b) by 111 days.

This patent is subject to a terminal disclaimer.

(21) Appl. No.: 16/937,572

(22) Filed: Jul. 23, 2020

(65) Prior Publication Data

US 2021/0372856 A1    Dec. 2, 2021

Related U.S. Application Data

(60) Provisional application No. 63/030,904, filed on May 27, 2020.

(51) Int. Cl.
*G01J 5/22* (2006.01)
*H01L 27/146* (2006.01)
*H04N 5/33* (2006.01)

(52) U.S. Cl.
CPC .......... *G01J 5/22* (2013.01); *H01L 27/14641* (2013.01); *H01L 27/14669* (2013.01); *H04N 5/332* (2013.01)

(58) Field of Classification Search
CPC ................. G01J 5/22; H01L 27/14641; H01L 27/14669; H04N 5/332
See application file for complete search history.

(56) References Cited

U.S. PATENT DOCUMENTS 7,629,582 B2    12/2009  Hoffman et al.
7,655,909 B2    2/2010   Schimert et al.
(Continued)

FOREIGN PATENT DOCUMENTS

EP    2757355 A1    7/2014
WO    2010033127 A1    3/2010

*Primary Examiner* — David P Porta
*Assistant Examiner* — Jeremy S Valentiner
(74) *Attorney, Agent, or Firm* — Renaissance IP Law Group LLP

(57) ABSTRACT

A pixel for an image sensor includes a resistive microbolometer sensor portion, a visible image sensor portion, and an output path. The resistive microbolometer sensor portion outputs a signal corresponding to an infrared (IR) image sensed by the resistive microbolometer sensor portion. The resistive microbolometer sensor portion uses no bias current. The visible image sensor portion outputs a signal corresponding to a visible image sensed by the visible image sensor portion. The output path is shared by the resistive microbolometer sensor portion and the visible image sensor portion, and may be controlled to selectively output the signal corresponding to the IR image, the signal corresponding to the visible image, or a fused image based on the IR image and the visible image. The resistive microbolometer sensor portion may sense a near infrared image or a longwave infrared image.

20 Claims, 14 Drawing Sheets

(56) References Cited

U.S. PATENT DOCUMENTS

| | | | | |
|---|---|---|---|---|
| 7,791,026 | B2* | 9/2010 | Liddiard | G08B 17/12 |
| | | | | 250/338.1 |
| 8,471,204 | B2 | 6/2013 | Bornfreund | |
| 9,741,761 | B2* | 8/2017 | Jiang | H04N 5/2256 |
| 9,791,322 | B2 | 10/2017 | Alacoque | |
| 10,600,187 | B2 | 3/2020 | Petilli | |
| 2007/0170359 | A1* | 7/2007 | Syllaios | G01J 3/2823 |
| | | | | 250/338.1 |
| 2010/0084556 | A1* | 4/2010 | Oh | H01L 27/14652 |
| | | | | 250/338.4 |
| 2011/0109762 | A1* | 5/2011 | Park | H04N 5/37457 |
| | | | | 348/222.1 |
| 2017/0330053 | A1* | 11/2017 | Park | G06K 9/4661 |
| 2019/0189671 | A1* | 6/2019 | Jin | H01L 27/14645 |
| 2020/0162684 | A1* | 5/2020 | Rotte | H04N 5/23216 |

\* cited by examiner

HYBRID VISIBLE/NIR AND LWIR SENSOR WITH RESISTIVE MICROBOLOMETER

CROSS-REFERENCE TO RELATED APPLICATION

This application claims the priority benefit under 35 U.S.C. § 119(e) of U.S. Provisional Application No. 63/030,904, filed on May 27, 2020, the disclosure of which is incorporated herein by reference in its entirety.

TECHNICAL FIELD

The subject matter disclosed herein relates to image sensors. More specifically, the subject matter disclosed herein relates to a hybrid pixel for an image sensor that provides visible/near infrared (NIR) and longwave infrared (LWIR) imaging using a resistive microbolometer that is combined into a single pixel with a complementary metal-oxide semiconductor (CMOS) image sensor (CIS).

BACKGROUND

A low-cost thermal LWIR sensor may be useful for advanced driver-assist systems (ADASs) and autonomous driving applications because an LWIR sensor does not need active illumination and may be able to sense a human object and/or other objects that are blocked by obstacles. Most thermal cameras include resistive bolometers that use a DC bias current for readout that may cause self-heating of the bolometer, and the readout circuit for a resistive bolometer may be complicated. Combining a visible-imaging capability and a thermal-imaging capability onto one sensor may significantly reduce system cost, enable improved night vision, improve object-recognition accuracy, and lower processing power consumption.

Most typical thermal cameras may provide only a thermal image that has a lower relative resolution in comparison to visible-image cameras. A typical imaging system that includes separate visible imagining and thermal imaging capabilities may be bulky and may be too hard to integrate into small form-factor applications. A thermal-only imaging camera also cannot detect important information in a visible image, such as signals and symbols.

SUMMARY

An example embodiment provides a pixel for an image sensor that may include a resistive microbolometer, a visible image sensor portion and an output path. The resistive microbolometer sensor portion may output a signal corresponding to an infrared (IR) image sensed by the resistive microbolometer sensor portion. The visible image sensor portion may output a signal corresponding to a visible image sensed by the visible image sensor portion. The output path may be shared by the resistive microbolometer sensor portion and the visible image sensor portion. The output path may be controlled to selectively output the signal corresponding to the IR image, the signal corresponding to the visible image, or a fused image based on the IR image and the visible image. In one embodiment, the resistive microbolometer sensor portion uses no bias current.

An example embodiment provides an image sensor that may include an array of pixels. At least one first pixel may include a resistive microbolometer, a visible image sensor portion. The resistive microbolometer sensor portion may output a signal corresponding to an IR image sensed by the resistive microbolometer sensor portion. The visible image sensor portion may output a signal corresponding to a visible image sensed by the visible image sensor portion of the first pixel. At least one second pixel may include a visible image sensor portion that outputs a visible image sensed by the visible image sensor portion of the second pixel. An output path may be shared by the resistive microbolometer sensor portion, the visible image sensor portion of the first pixel, and the visible image sensor portion of the second pixel. The output path may be controlled to selectively output the signal corresponding to the IR image, the signal corresponding to the visible image sensed by the visible image sensor portion of the first pixel, a fused image based on the IR image and the visible image of the first pixel, or the signal corresponding to the visible image sensed by the visible image sensor portion of the second pixel. In one embodiment, the resistive microbolometer sensor portion uses no bias current. In another embodiment, the output path may be shared by the resistive microbolometer sensor portion, the visible image sensor portion of the first pixel, and the visible image sensor portion of the second pixel. In still another embodiment, the output path may be shared by four visible image sensor portions and the resistive microbolometer sensor portion. In yet another embodiment, the output path may be shared by eight visible image sensor portions and the resistive microbolometer sensor portion.

An example embodiment provides a pixel for an image sensor that may include a resistive microbolometer, a visible image sensor portion and an output path. The resistive microbolometer sensor portion may output a signal corresponding to an IR image sensed by the resistive microbolometer sensor portion. The visible image sensor portion may output a signal corresponding to a visible image sensed by the visible image sensor portion in which the visible image sensor portion may include a photodiode. The output path may be shared by the resistive microbolometer sensor portion and the visible image sensor portion in which the output path may be controlled to selectively output the signal corresponding to the IR image, the signal corresponding to the visible image, or a fused image based on the IR image and the visible image of the pixel. In one embodiment, the pixel may be one pixel of an array of pixels.

BRIEF DESCRIPTION OF THE DRAWING

In the following section, the aspects of the subject matter disclosed herein will be described with reference to exemplary embodiments illustrated in the figure, in which:

FIGS. 6A-6J respectively depict example embodiments of arrays of different physical arrangements or placements of hybrid pixels or of visible pixels (R,G,B) and microbolometer pixels (IR) according to the subject matter disclosed herein;

DETAILED DESCRIPTION

Figure 1:
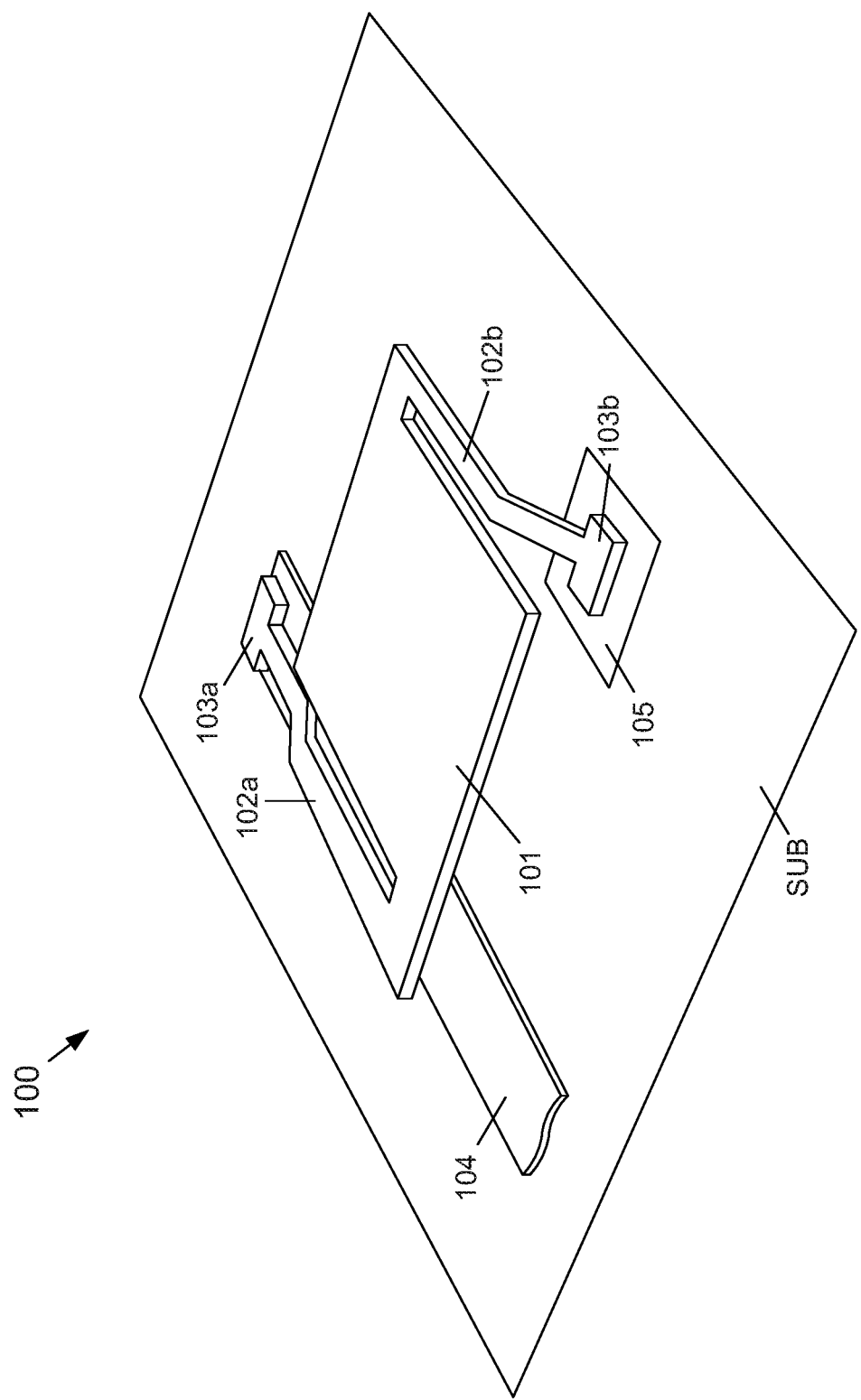
FIG. 1 depicts a perspective view of an example embodiment of a resistive microbolometer that may be used in the example embodiments of a pixel and readout circuit for an image sensor according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to an image sensor that may include a hybrid pixel that includes a resistive microbolometer and photodiode in the same pixel in which the resistive microbolometer and the photodiode share the same readout circuitry. The hybrid pixel may provide a fused visible/NIR or a fused visible/LWIR image in addition to a visible image that is separate from a NIR and/or a LWIR image. In one embodiment, an array of hybrid pixels may provide a fused visible/NIR image, a fused visible/LWIR image, and/or separate visible, NIR and/or LWIR images. A metalens may be used with a pixel array that includes the hybrid pixels disclosed herein to achieve visible/NIR/LWIR imaging in one sensor and in which the visible/NIR/LWIR image information uses the same readout architecture, circuitry and path. The visible and infrared image information output from the hybrid pixel (whether fused or separate) may be used for, but not limited to, ADAS, mobile, industrial, and robotics applications.

The hybrid visible/infrared imaging pixel disclosed herein includes a resistive microbolometer that has a low self-heating characteristic because no DC biasing is used and includes a low power-consumption readout. The low self-heating and low-power characteristics of the hybrid image sensor provide an improved accuracy for infrared images over traditional resistive bolometer-based infrared imagers.

FIG. 1 depicts a perspective view of an example embodiment of a resistive microbolometer 100 that may be used in the example embodiments of a pixel and readout circuit for an image sensor according to the subject matter disclosed herein. The microbolometer 100 may be formed on a substrate SUB and may include an infrared (IR) absorber element 101, two conductive support members 102a and 102b, and two electrodes 103a and 103b. The IR absorber element 101 may be formed from layers of amorphous silicon (a-Si) and/or layers of vanadium oxide ($V_2O_5$). The resistivity of the IR absorber element 101 may change as a function of the amount of IR radiation that the IR absorber element 101 absorbs. In one embodiment, the IR absorber element 101 may be about 50 μm×50 μm in size and about 0.5 μm thick. Other sizes and shapes are possible. The electrodes 103a and 103b may be respectively electrically connected to a power supply voltage (or ground) 104 and to a source/drain (S/D) diffusion or terminal 105. In some embodiments, a reflector (not shown) may be located behind the IR absorber element 101 (i.e., between the IR absorber element 101 and the substrate SUB) so that the reflector is distal from an IR source (not shown) with respect to the IR absorber element.

Figures 2A, 2B:
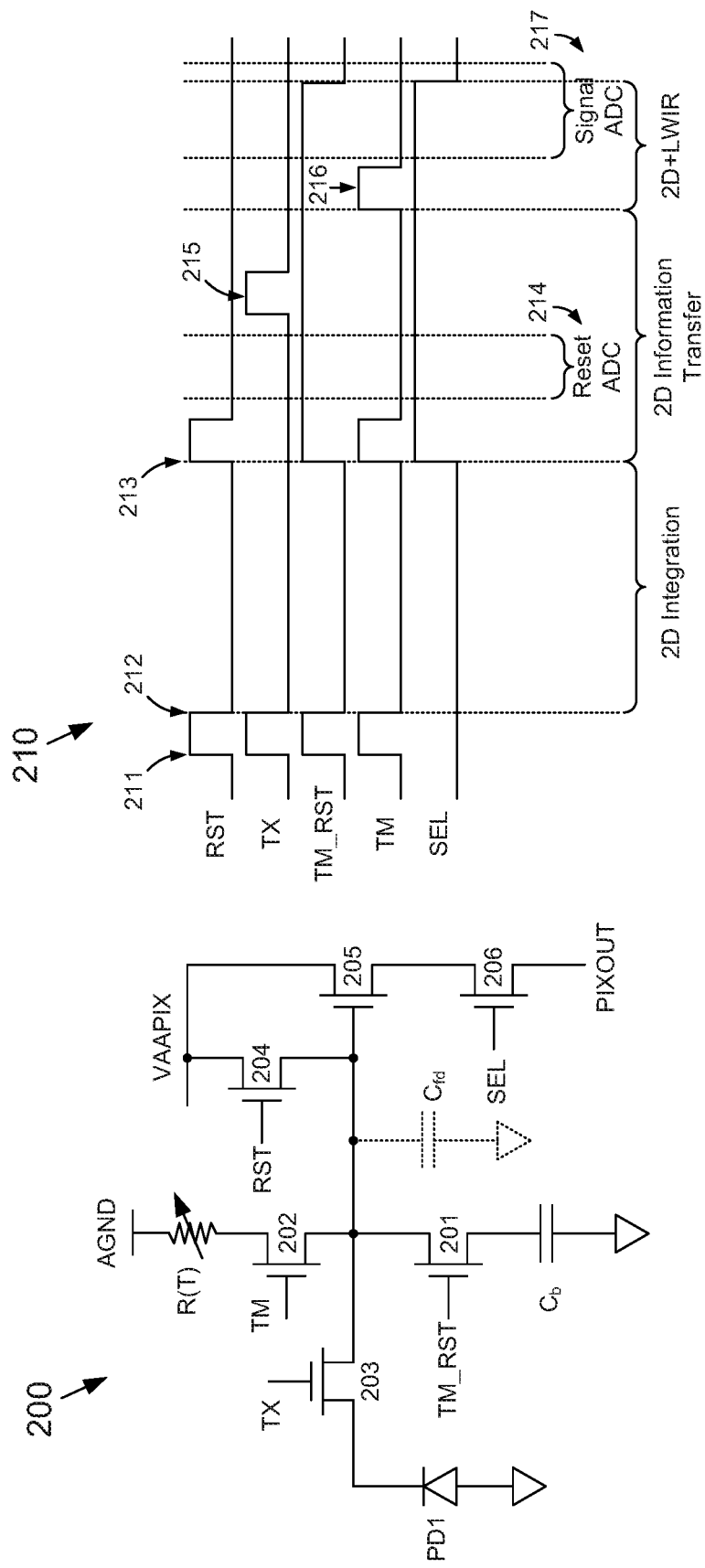
FIG. 2A is a schematic diagram of an example embodiment of a hybrid pixel that includes a resistive microbolometer and a photodiode according to the subject matter disclosed herein.
FIG. 2B shows a relative timing diagram for the example embodiment of the hybrid pixel shown in FIG. 2A when operated to output image information for a separated, combined, or fused, 2D/NIR image or a 2D/LWIR image according to the subject matter disclosed herein.

FIG. 2A is a schematic diagram of an example embodiment of a hybrid pixel 200 that includes a resistive microbolometer and a photodiode according to the subject matter disclosed herein. The hybrid pixel 200 may be operated to output image information for a separated, combined, or fused, two dimensional/NIR (2D/NIR) image or 2D/LWIR image. Alternatively, the hybrid pixel 200 may be operated to output separate 2D image information and NIR (or LWIR) image information. The hybrid pixel 200 may include a capacitor $C_b$, a resistive microbolometer R(T), a photodiode PD1, and n-channel metal-oxide-semiconductor field-effect transistors (MOSFETs) 201-206.

The capacitor $C_b$ may be used to change a discharge time that represents IR information. That is, the IR information is a function of the time constant formed by $C_b$ and the resistive microbolometer R(T). The capacitor $C_b$ may include a first terminal and a second terminal. The first terminal of the capacitor $C_b$ may be coupled to a first potential, such as ground. The MOSFET 201 may include a first S/D terminal coupled to the second terminal of the capacitor $C_b$. A gate terminal of the MOSFET 201 may be coupled to a TM_RST signal.

The MOSFET 202 may include a first S/D terminal coupled to the second S/D terminal of the MOSFET 201. The node at the connection of the first terminal of the MOSFET 202 and the second terminal of the MOSFET 201 may be a floating diffusion (FD). The floating diffusion may include a parasitic capacitance $C_{fd}$.

A gate terminal of the MOSFET 202 may be coupled to a TM signal. The second S/D terminal of the MOSFET 202 may be coupled to a first terminal of the resistive microbolometer R(T). A second terminal of the resistive microbolometer R(T) may be coupled to a second potential, such as an analog ground AGND.

A first S/D terminal of the MOSFET 203 may be coupled to the node at the connection of the first terminal of the MOSFET 202 and the second terminal of the MOSFET 201. A second S/D terminal of the MOSFET 203 may be coupled to a first terminal of the photodiode PD1, and a gate terminal of the MOSFET 203 may be coupled to a TX signal.

The photodiode PD1 may be an electron-type positive-intrinsic-negative (PIN) diodes or shallow positive-negative (PN) junction that may be used to detect a 2D image. The resistive microbolometer R(T) may be located in same semiconductor die and/or a different semiconductor die as the photodiode PD1.

A first S/D terminal of the MOSFET 204 may be coupled to the second S/D terminal of the MOSFET 201 and the first S/D terminal of the MOSFET 202. A second S/D terminal of the MOSFET 204 may be coupled to a third potential, such as VAAPIX. A gate terminal of the MOSFET 204 may be coupled to a RST signal.

A gate terminal of the MOSFET 205 may be coupled to the FD node. A first S/D terminal of the MOSFET 205 may be coupled to the third potential (i.e., VAAPIX). A second S/D terminal of the MOSFET 205 may be coupled to a first S/D terminal of the MOSFET 206. A gate terminal of the MOSFET 206 may be coupled to a SEL signal, and the second S/D terminal of the MOSFET 206 may be coupled to a PIXOUT line.

FIG. 2B shows a relative timing diagram 210 for the example embodiment of the hybrid pixel 200 shown in FIG. 2A when operated to output image information for a combined, or fused, 2D/NIR image or a 2D/LWIR image according to the subject matter disclosed herein.

At 211, all nodes of the hybrid pixel 200 are reset when the RST, TX, TM_RST and TM signals are true (high) at the same time. At 212, integration starts to obtain 2D image information after the TX, RST, TM_RST and TM signals have been released. After integration completes at 213, all nodes are reset in order to read a reference level $V_{rst}$ to perform a Correlated Double Sampling (CDS) operation that removes kT/C noise and to reset the Analog-to-Digital Converter (ADC) (not shown) for the pixel 200 at 214. After reading $V_{rst}$ from the sensor, charge is transferred at 215 from the photodiode PD1 through MOSFET 203 to the floating diffusion FD node. At 216, the MOSFET 202 is turned on to fuse 2D image with LWIR image information. At 217, an ADC operation is performed on that signal that is $V_{rst}-V_{signal}-V_{thermal}$ in which $V_{signal}$ is a voltage that represents the 2D image information and $V_{thermal}$ is a voltage that represents the NIR image information and is a function of the time constant formed by $C_b$ and R(T) (or more accurately $C_b+C_{fd}$ and R(T)). At 213, the SEL signal turns on the MOSFET 206 to output the fused 2D/NIR image information from the PIXOUT node.

Figure 2C:
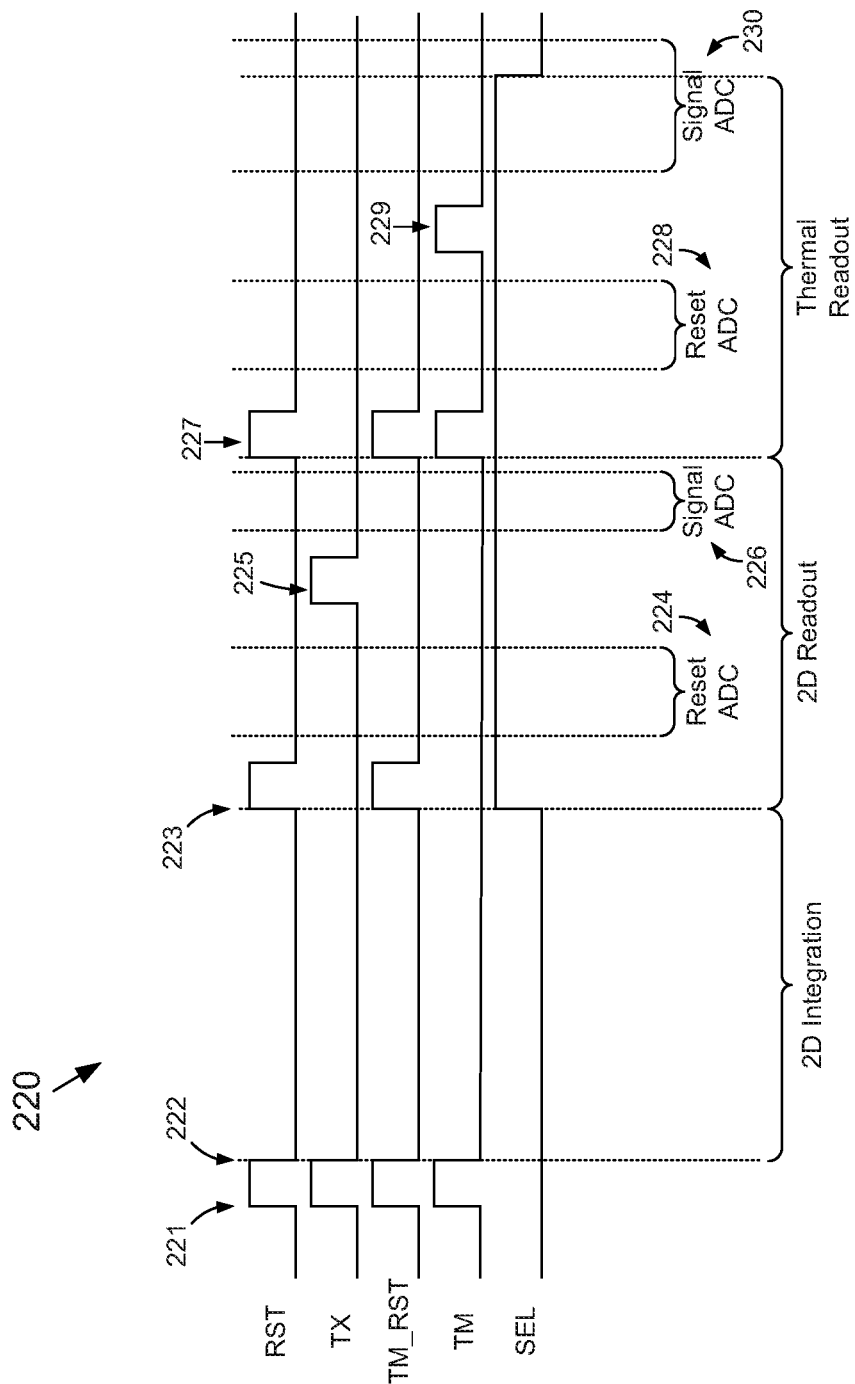
FIG. 2C shows a relative timing diagram for the example embodiment of the hybrid pixel shown in FIG. 2A when operated to output separate 2D (or 2D/NIR) image information and LWIR image information according to the subject matter disclosed herein.

FIG. 2C shows a relative timing diagram 220 for the example embodiment of the hybrid pixel 200 shown in FIG. 2A when operated to output separate 2D image information and NIR (or LWIR) image information according to the subject matter disclosed herein.

At 221, all nodes of the hybrid pixel 200 are reset when RST, TX, TM_RST and TM signals are true (high) at the same time. At 222, integration starts to obtain 2D image information after release of the TX, RST, TM_RST, and TM signals. After integration completes at 223, the FD is reset to read a reference level $V_{rst}$ to perform a CDS operation to remove kT/C noise and reset the ADC for 2D imaging at 224. After reading $V_{rst}$ from the sensor, charge is transferred at 225 from the PD1 through MOSFET 203 to the FD node, and an ADC operation is performed to obtain 2D image information at 226. At 227, the TM_RST, RST and the TM signals respectively turn on the MOSFETs 201, 204 and 202 to read reset level for IR imaging. At 228, the ADC is reset for IR imagining. At 229, the MOSFET 202 is turned on for a predetermined time and an ADC operation is performed at 230 for an IR image information that is function of the time constant formed by $C_b$ and R(T) (or more accurately $C_b+C_{fd}$ and R(T)). At 223, the SEL signal turns on the MOSFET 206 to output the 2D imaging information at 226 and the NIR image information at 230.

Figures 3A, 3B:
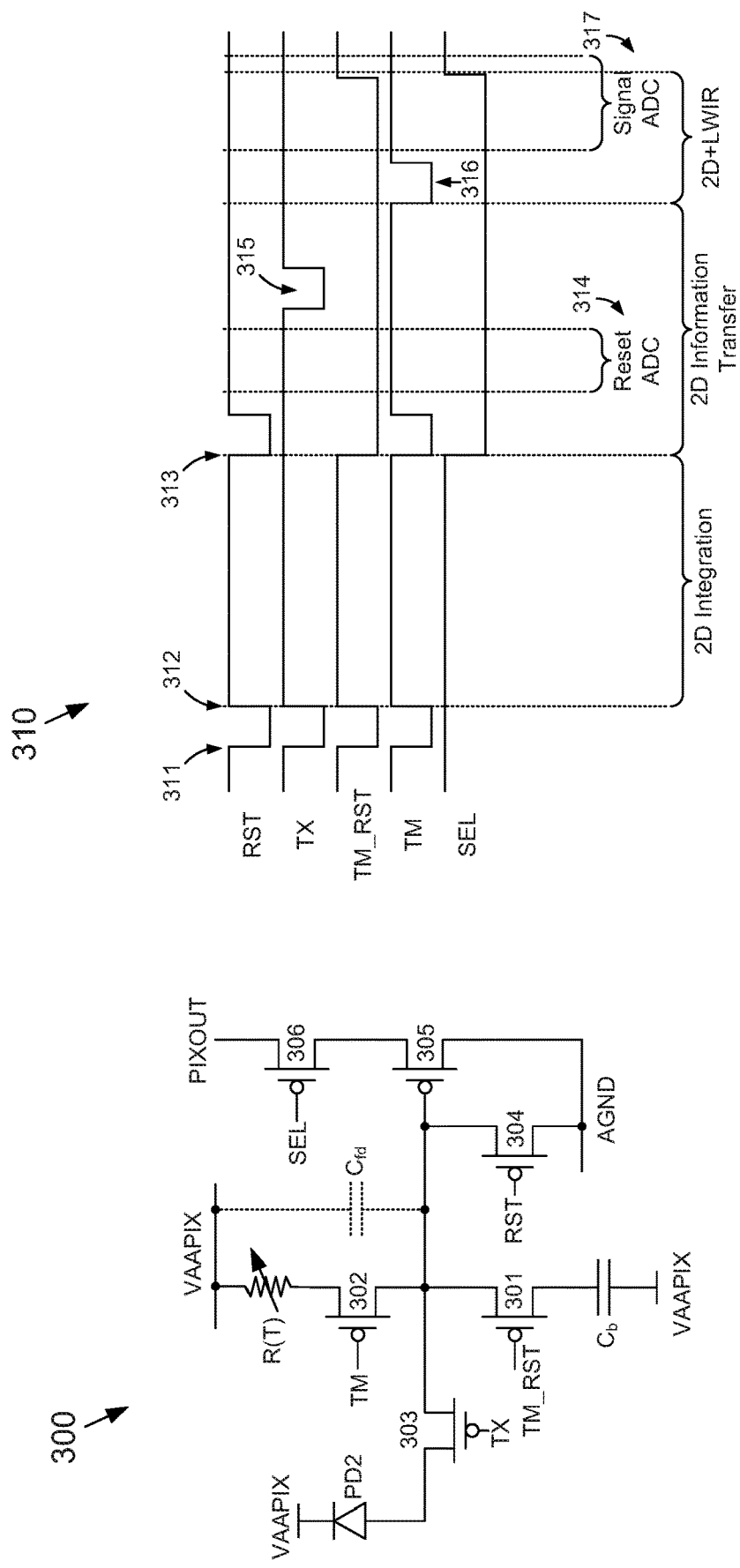
FIG. 3A is a schematic diagram of another example embodiment of a hybrid pixel for an image sensor according to the subject matter disclosed herein. The hybrid pixel may be operated to output image information for a separated, combined, or fused, 2D/NIR image or a 2D/LWIR image.
FIG. 3B shows a relative timing diagram for the example embodiment of the hybrid pixel shown in FIG. 3A when operated to output image information for a separated, combined, or fused, 2D/NIR image or a 2D/LWIR image according to the subject matter disclosed herein.

FIG. 3A is a schematic diagram of another example embodiment of a hybrid pixel 300 for an image sensor according to the subject matter disclosed herein. The hybrid pixel 300 may be operated to output image information for a combined, or fused, 2D/NIR image or a 2D/LWIR image. Alternatively, the hybrid pixel 300 may be operated to output separate 2D image information and NIR (or LWIR) image information. The hybrid pixel 300 may include a capacitor $C_b$, a resistive microbolometer R(T), a photodiode PD2, and p-channel MOSFETs 301-306.

The capacitor $C_b$ may be used to change a discharge time that represents IR information. That is, the IR information is a function of the time constant formed by $C_b$ and the resistive microbolometer R(T). The capacitor $C_b$ may include a first terminal and a second terminal. The first terminal of the capacitor $C_b$ may be coupled to a first potential, such as VAAPIX. The MOSFET 301 may include a first S/D terminal coupled to the second terminal of the capacitor $C_b$. A gate terminal of the MOSFET 301 may be coupled to a TM_RST signal.

The MOSFET 302 may include a first S/D terminal coupled to the second S/D terminal of the MOSFET 301. The node at the connection of the first terminal of the MOSFET 302 and the second terminal of the MOSFET 301 may be a floating diffusion (FD). The floating diffusion may include a parasitic capacitance $C_{fd}$.

A gate terminal of the MOSFET 302 may be coupled to a TM signal. The second S/D terminal of the MOSFET 302 may be coupled to a first terminal of a resistive microbolometer R. A second terminal of the resistive microbolometer R may be coupled to a second potential, such as an analog ground VAAPIX.

A first S/D terminal of the MOSFET 303 may be coupled to the node at the connection of the first terminal of the MOSFET 302 and the second terminal of the MOSFET 301. A second S/D terminal of the MOSFET 303 may be coupled to a first terminal of the photodiode PD2, and a gate terminal of the MOSFET 303 may be coupled to a TX signal.

The photodiode PD2 may be a hole-type PIN photodiode or shallow PN junction that may be used to detect a 2D image. The resistive microbolometer R(T) may be placed in same semiconductor die and/or different semiconductor die as the photodiode PD2.

A first S/D terminal of the MOSFET 304 may be coupled to the second S/D terminal of the MOSFET 301 and the first S/D terminal of the MOSFET 302. A second S/D terminal of the MOSFET 304 may be coupled to a third potential, such as AGND. A gate terminal of the MOSFET 304 may be coupled to a RST signal.

A gate terminal of the MOSFET 305 may be coupled to the FD node. A first S/D terminal of the MOSFET 305 may be coupled to the third potential (i.e., AGND). A second S/D terminal of the MOSFET 305 may be coupled to a first S/D terminal of the MOSFET 306. A gate terminal of the MOSFET 306 may be coupled to a SEL signal, and the second S/D terminal of the MOSFET 306 may be coupled to a PIXOUT line.

FIG. 3B shows a relative timing diagram 310 for the example embodiment of the hybrid pixel 300 shown in FIG. 3A when operated to output image information for a combined, or fused, 2D/NIR image or a 2D/LWIR image according to the subject matter disclosed herein.

At 311, all nodes of the hybrid pixel 300 are reset when the RST, TX, TM_RST and TM signals are true (low) at the same time. At 312, integration starts to obtain 2D image information after the TX, RST, TM_RST and TM signals have been released. After integration completes at 313, all nodes are reset to read a reference level $V_{rst}$ in order to perform a CDS operation to remove kT/C noise and to reset the ADC (not shown) at 314. After reading $V_{rst}$ from the sensor, charge is transferred at 315 from the PD2 through the MOSFET 303 to the FD node. At 316, the MOSFET 302 is turned on to fuse the 2D image information with the LWIR image information. At 317, an ADC operation is performed on that signal that is $V_{rst}-V_{signal}-V_{thermal}$, in which $V_{signal}$ is a voltage that represents the 2D image information and $V_{thermal}$ is a voltage that represents the NIR image information and is a function of the time constant formed by $C_b$ and R(T) (or more accurately $C_b+C_{fd}$ and R(T)). At 313, the SEL signal turns on the MOSFET 306 to output the fused 2D/NIR image information from the PIXOUT node.

Figure 3C:
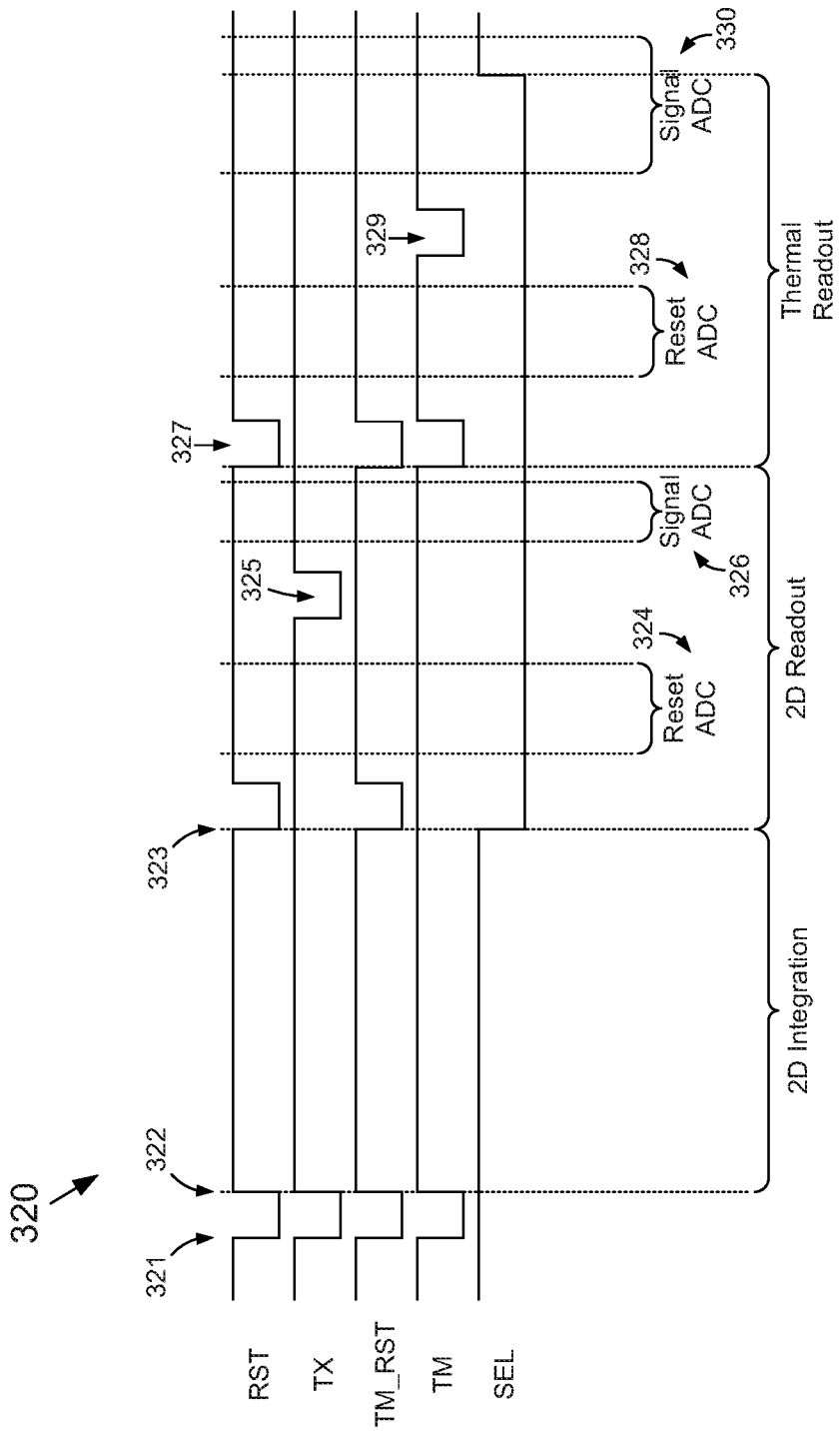
FIG. 3C shows a relative timing diagram for the example embodiment of the hybrid pixel shown in FIG. 3A when operated to output separate 2D (or 2D/NIR) image information and LWIR image information according to the subject matter disclosed herein.

FIG. 3C shows a relative timing diagram 320 for the example embodiment of the hybrid pixel 300 shown in FIG. 3A when operated to output separate 2D image information and NIR (or LWIR) image information according to the subject matter disclosed herein.

At 321, all nodes of the hybrid pixel 300 are reset when the RST, TX, TM_RST and TM signal are true (low) at the same time. At 322, integration begins to obtain 2D image information after the TX, RST, TM_RST and TM signals have been released. After integration completes at 323, the FD node is reset to read a reference level $V_{rst}$ to perform a CDS operation to remove kT/C noise and to reset ADC for 2D imagining at 324. After reading $V_{rst}$ from sensor, charge is transferred at 325 from the PD2 through the MOSFET 303 to the FD node, and an ADC operation is performed for a 2D image at 326. At 327, the TM_RST, RST and the TM signals are switched to be true (low) to read a reset level for IR imaging, and then at 328 to reset the ADC for IR image information. At 329, the MOSFET 302 is turned on for a predetermined time and an ADC operation is performed at 330 for IR image information that is function of the time constant formed by $C_b$ and R(T) (or more accurately $C_b+C_{fd}$ and R(T)). At 323, the SEL signal turns on the MOSFET 306 to output the 2D imaging information at 326 and the NIR image information at 330.

Figure 4A:
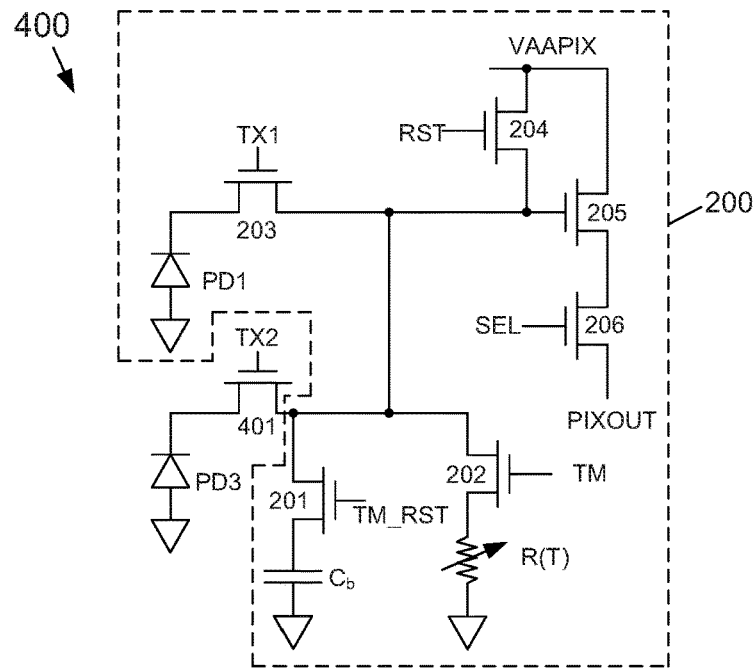
FIG. 4A is a schematic diagram of an example embodiment of a hybrid pixel for an image sensor in which a resistive microbolometer is shared with two photodiodes according to the subject matter disclosed herein.
Figure 4B:
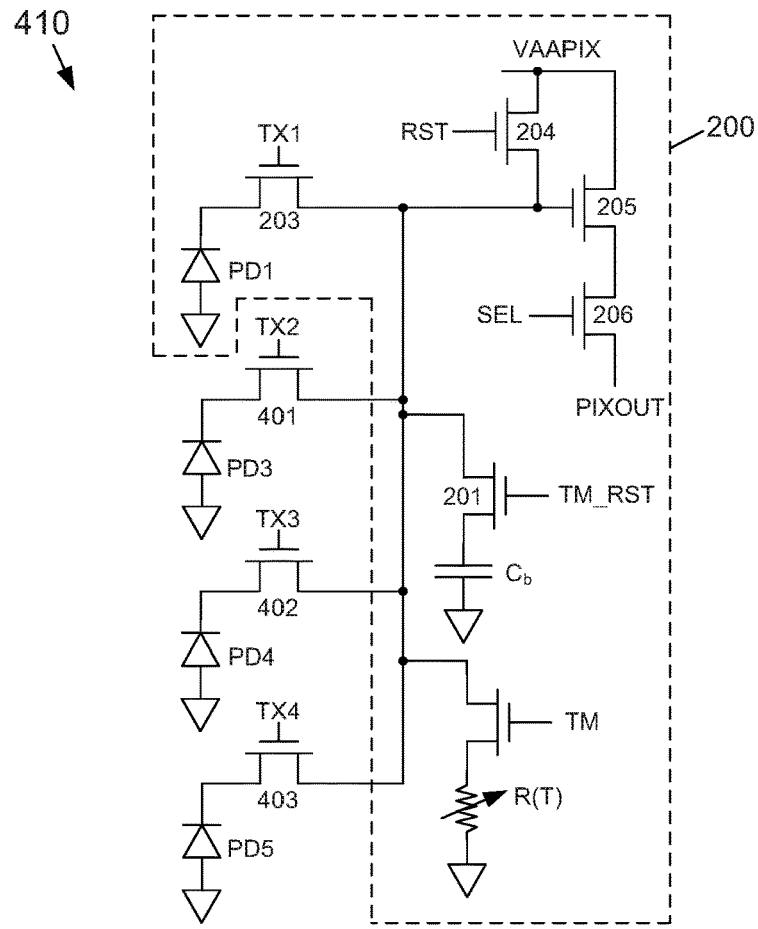
FIG. 4B is a schematic diagram of an example embodiment of a hybrid pixel for an image sensor in which a resistive microbolometer is shared with four photodiodes according to the subject matter disclosed herein.

FIG. 4A is a schematic diagram of an example embodiment of a hybrid pixel 400 for an image sensor in which a resistive microbolometer is shared with two photodiodes according to the subject matter disclosed herein. The embodiment 400 shown in FIG. 4A includes the hybrid pixel 200 shown in FIG. 2A, and includes a MOSFET 401 and a second photodiode PD3 to form a shared PD/microbolometer architecture. The portion of the embodiment 400 that is the hybrid pixel 200 is indicated by a dashed line. It should be understood that the resistive microbolometer R(T) may be shared as much as possible (i.e., 2 to N times). A 2-1 sharing arrangement may be a typical (two PDs and one resistive microbolometer) sharing arrangement (FIG. 4A). A 4-1 sharing arrangement 410 may include four 4 PDs and one resistive microbolometer and is depicted in FIG. 4B. The embodiment 410 includes the hybrid pixel 200 (FIG. 2A) and includes MOSFET 401-403 and a photodiodes PD3-PD5. The portion of the embodiment 410 that is the hybrid pixel 200 is indicated by a dashed line. An 8-1 sharing arrangement would include eight PDs and one resistive microbolometer.

Figure 5A:
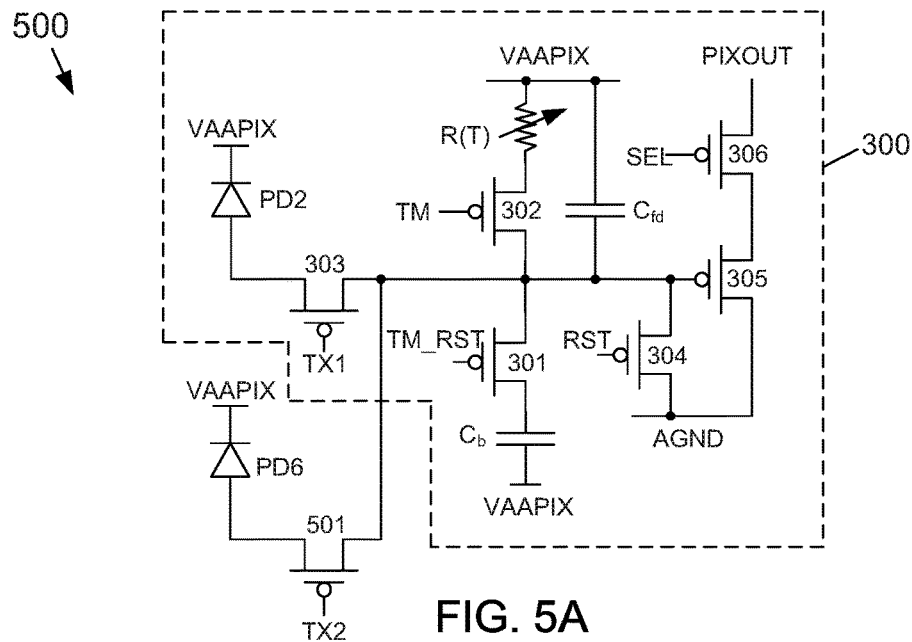
FIG. 5A is a schematic diagram of another example embodiment of a hybrid pixel for an image sensor in which a resistive microbolometer is shared with two photodiode according to the subject matter disclosed herein.
Figure 5B:
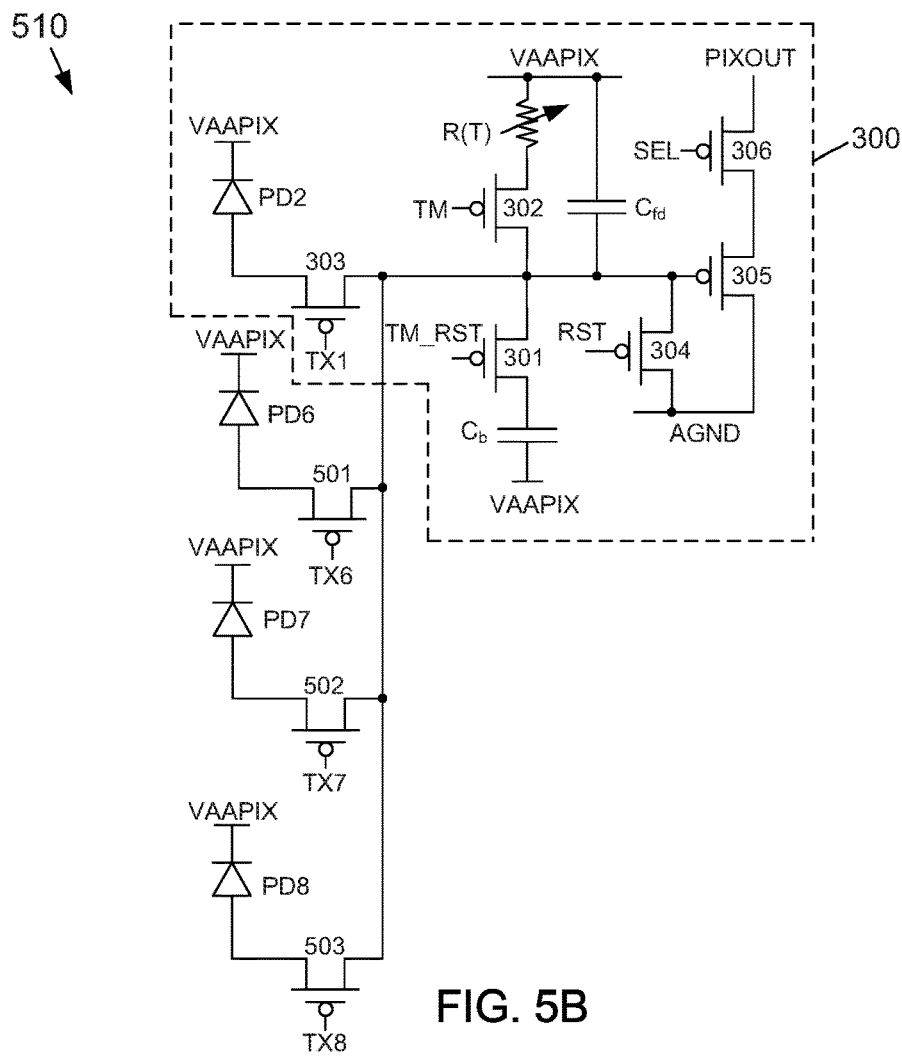
FIG. 5B is a schematic diagram of another example embodiment of a hybrid pixel for an image sensor in which a resistive microbolometer is shared with four photodiode according to the subject matter disclosed herein.

FIG. 5A is a schematic diagram of another example embodiment of a hybrid pixel 500 for an image sensor in which a resistive microbolometer is shared with two photodiode according to the subject matter disclosed herein. The embodiment 500 shown in FIG. 5A includes the hybrid pixel 300 shown in FIG. 3A, and includes a MOSFET 501 and a second photodiode PD6 to form a shared PD/microbolometer architecture. The portion of the embodiment 500 that is the hybrid pixel 300 is indicated by a dashed line. It should be understood that the resistive microbolometer R(T) may be shared as much as possible (i.e., 2 to N times). A 2-1 sharing arrangement may be a typical (two PDs and one resistive microbolometer) arrangement (FIG. 5A). A 4-1 sharing arrangement 510 may include four 4 PDs and one resistive microbolometer and is depicted in FIG. 5B. The embodiment 510 includes the hybrid pixel 300 (FIG. 3A) and includes MOSFET 501-503 and a photodiodes PD6-PD9. The portion of the embodiment 510 that is the hybrid pixel 300 is indicated by a dashed line. An 8-1 sharing arrangement would include eight PDs and one resistive microbolometer.

Figure 6A:
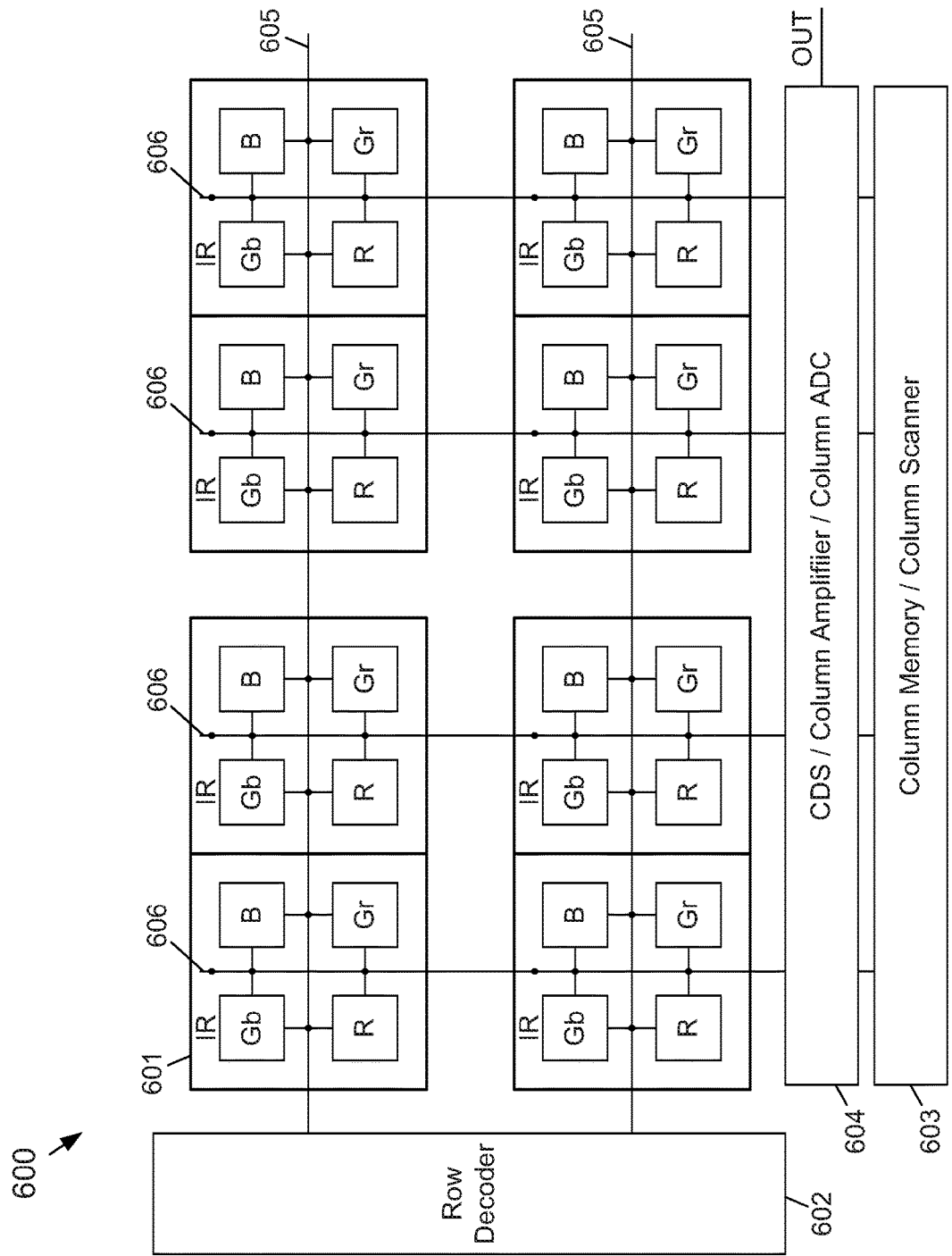

FIG. 6A depicts an example embodiment of a portion of another array 600 of hybrid pixels 601 according to the subject matter disclosed herein. The array 600 may be used with a backside illuminated (BSI) image sensor or a stacked image sensor in which the peripheral components may be located on a die or substrate that is different from the die or substrate on which the array 600 is located.

In the array 600, a hybrid pixel 601 includes four visible sensor portions and one microbolometer portion that share an output path. For example, a hybrid pixel 601 includes four visible sensor portions indicated as red (R), green (Gb and Gr) and blue (B). The hybrid pixel 601 also includes one microbolometer portion, indicated as IR. In one embodiment, the IR pixel may be physically as large as the four visible sensor portions that with which the IR pixel shares an output path.

Peripheral components may include a row decoder 602 and a column decoder 603 that may be connected to the array 600 as depicted. One embodiment may include peripheral components 604 for correlated double sampling (CDS), column amplifiers and/or column analog-to-digital converters (ADCs). Rows 605 may extend from the row decoder 602, and output paths 606 (e.g., PIXOUT paths) may extend from the hybrid pixels 601 to the components 604 and/or the column decoder 603. An output may be obtained at OUT.

Figure 6B:
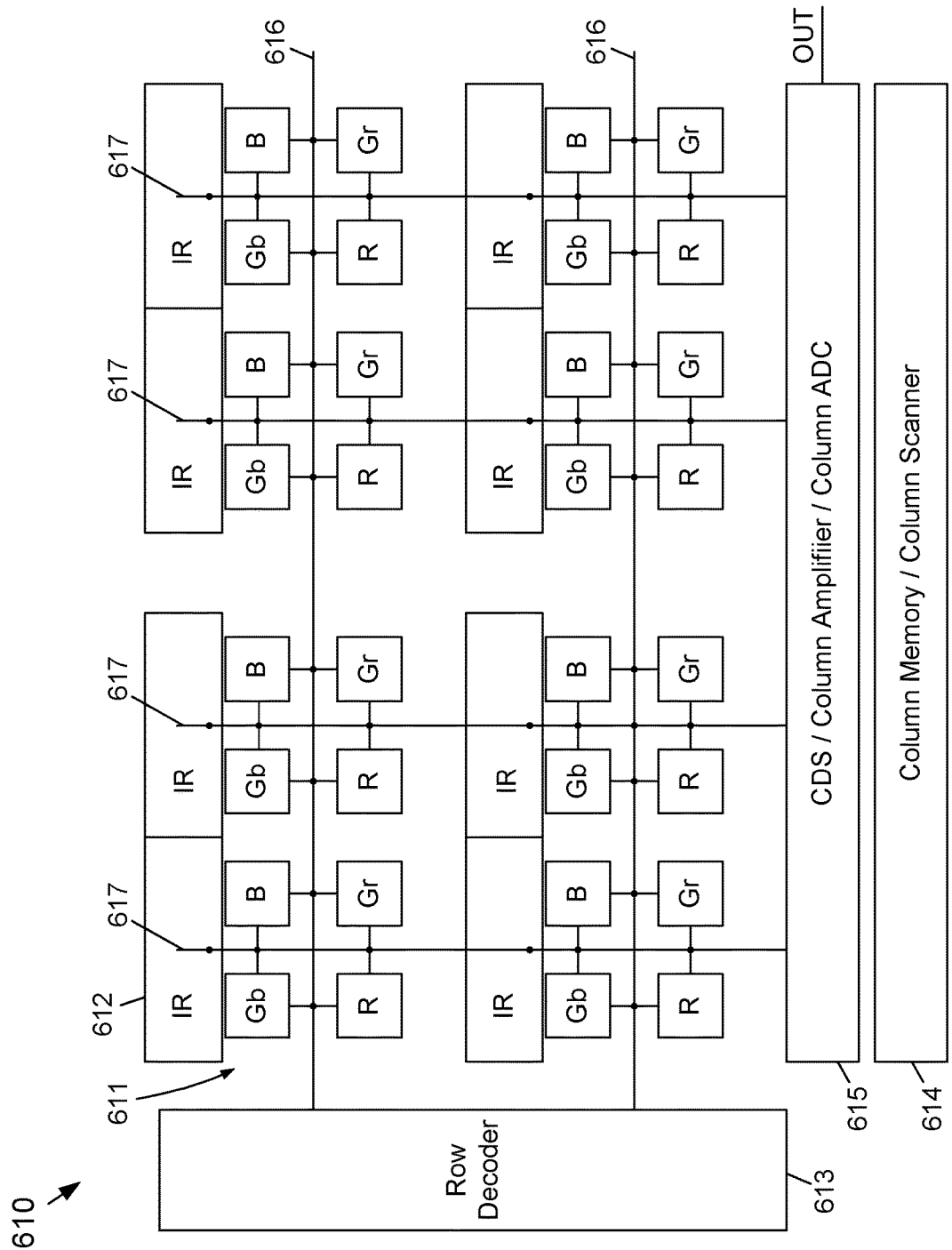

FIG. 6B depicts an example embodiment of a portion of an array 610 of visible pixels 611 and capacitive microbolometer pixels 612 according to the subject matter disclosed herein. The array 610 may be used with a frontside illuminated (FSI) or a backside illuminated (BSI) image sensor.

In the array 610, four visible CIS pixels and one microbolometer IR pixel share an output path. For example, four visible CIS pixels indicated as (R), Gb, Gr, and B and an IR pixel share an output path. In one embodiment, the IR pixel may be located adjacent to the four visible CIS pixels.

Peripheral components for the array 610 may include a row decoder 613 and a column decoder 614 that may be connected to the array 610 as depicted. One embodiment may include peripheral components 615 for correlated double sampling, column amplifiers and/or column ADCs. Rows 616 may extend from the row decoder 613, and output paths 617 (e.g., PIXOUT paths) may extend from the capacitive microbolometer pixels 612 to the components 615 and/or the column decoder 614. An output may be obtained at OUT.

Figures 6C, 6D, 6E, 6F, 6G, 6H:
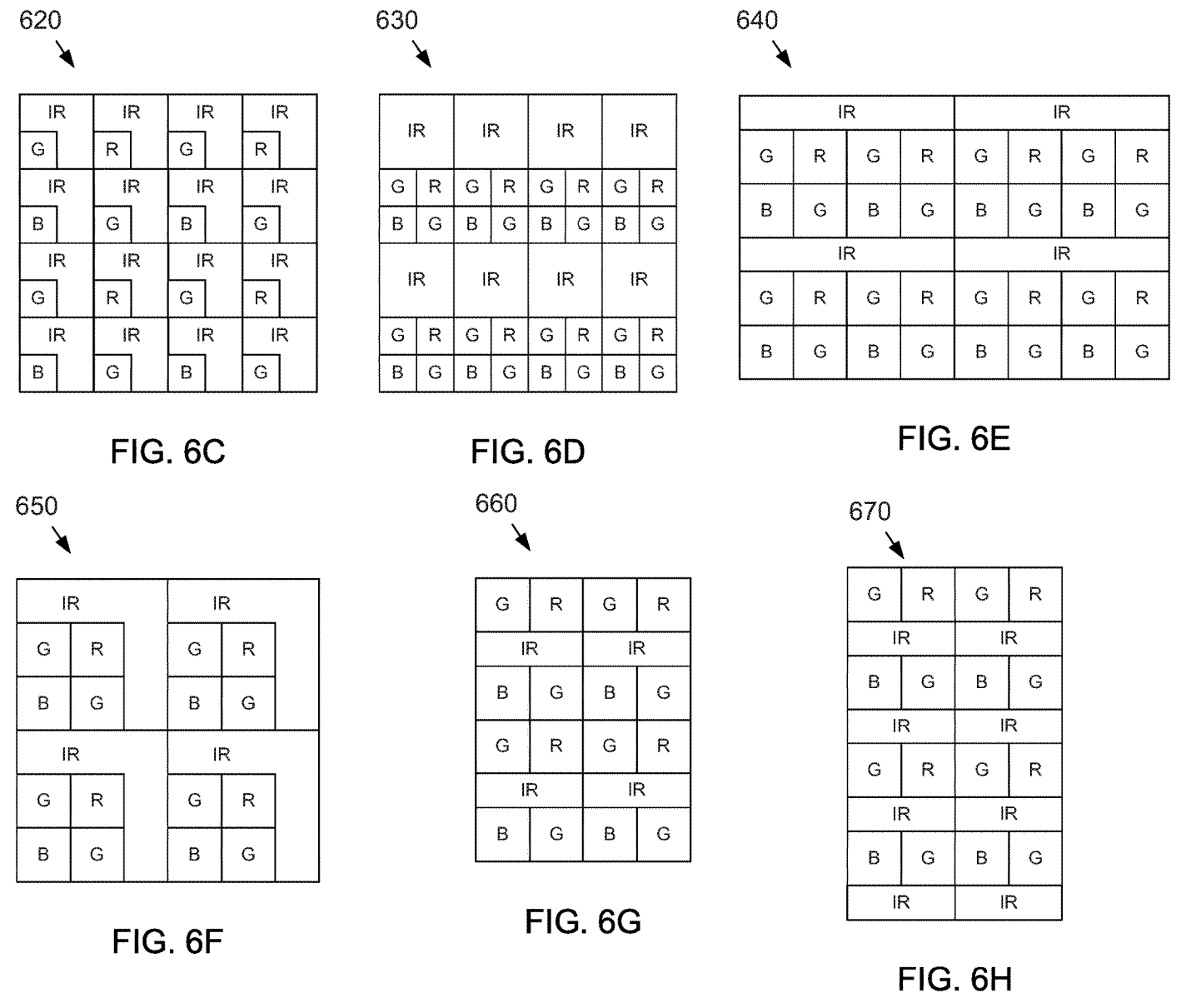

FIGS. 6C-6J respectively depict example embodiments of arrays of different physical arrangements or placements of hybrid pixels or of visible pixels (R, G, B) and microbolometer pixels (IR) according to the subject matter disclosed herein. The arrays depicted in FIGS. 6C-6J may be used with FSI image sensors. FIG. 6C depicts an example array 620 in which each pixel is a hybrid pixel similar to the hybrid pixels 200 or 300 respectively depicted in FIGS. 2A and 3A. FIG. 6D depicts an example array 630 in which four visible CIS pixels share one microbolometer pixel IR. FIG. 6E depicts an example array 640 in which eight visible CIS pixels share one microbolometer pixel IR.

Figure 6J:
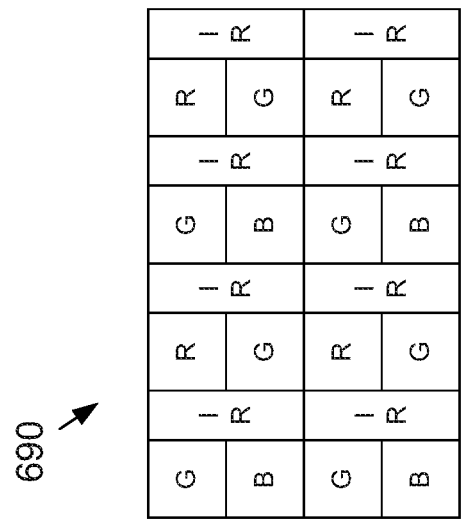
Figure 6I:
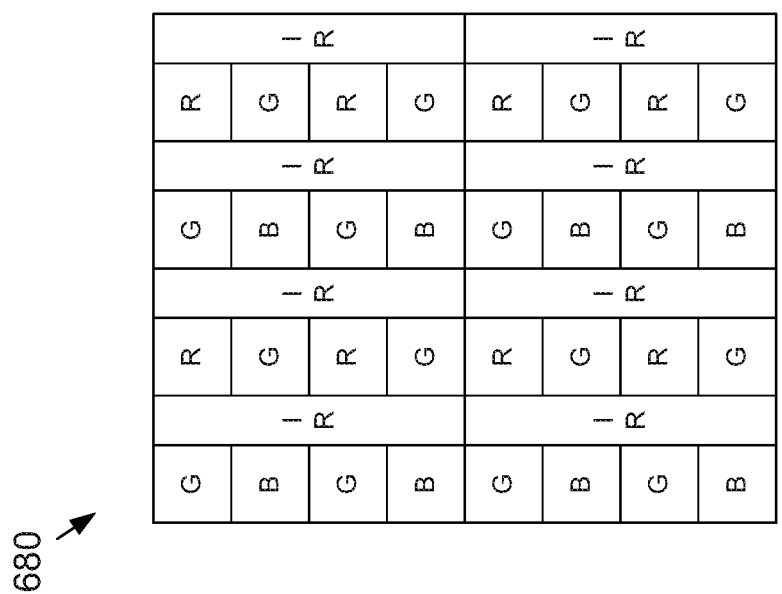

FIGS. 6F and 6G respectively depict example arrays 650 and 660 in which four visible CIS pixels share one microbolometer pixel IR. FIG. 6H depicts an example array 670 in which two CIS pixels share one microbolometer pixel IR. FIG. 6I depicts an example array 680 in which four CIS pixels share one microbolometer pixel IR. FIG. 6J depicts an example array 690 in which two CIS pixels share one microbolometer pixel IR.

Figure 7A:
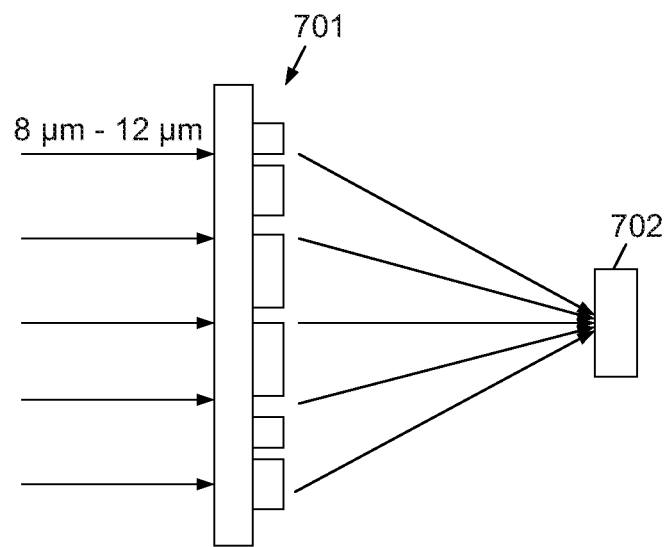
FIGS. 7A-7D depict an example embodiments of optics that may be used with the hybrid pixels disclosed herein.

FIG. 7A depicts an example embodiment of optics that may be used with the hybrid pixels disclosed herein. The optics may include a global meta-lens 701 that focuses infrared radiation having, for example, wavelengths between about 8 μm and about 12 μm, toward an array of hybrid pixels 702. In one embodiment, the global meta-lens 701 that may include a thin flat on-chip metasurface lens may be used for LWIR imaging, NIR imaging or both LWIR and NIR imaging. The metasurface lens may be formed from nanostructures that include amorphous Si (a-Si) and/or any other dielectric materials that may be transparent to the wavelengths in a desired spectrum. Such a metasurface lens may be fabricated on a flat, transparent substrate at low cost using a single step conventional ultra violet (UV) fabrication technique. Nanostructures may be fabricated with different geometric dimensions and arrangements to focus light at the same focal distance for each wavelength or at different focal distances at the same spatial or at different spatial location according to a desired application. In another embodiment, a thin flat metasurface may include dielectric nanostructures may be used for focusing light at visible/NIR wavelengths (0.4 µm-1 µm) and at LWIR (8 µm-12 µm) wavelengths for simultaneous imaging at visible/NIR and LWIR.

Figure 7B:
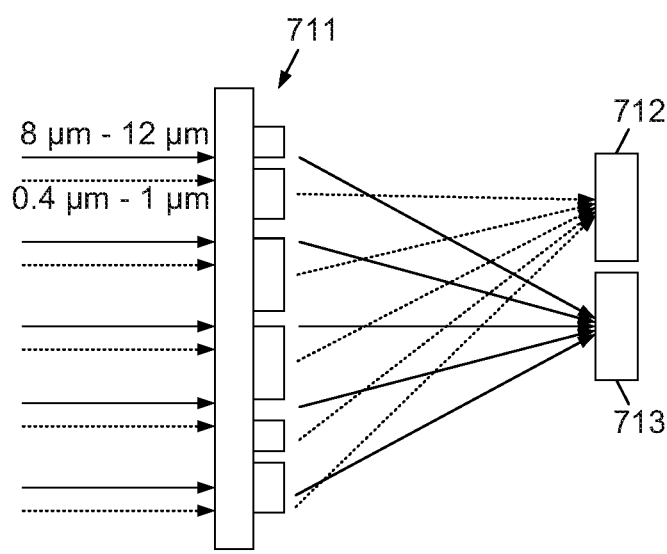

FIG. 7B depicts an example embodiment of optics that may be used with the hybrid pixels disclosed herein. The optics may include a global meta-lens 711 that focuses different wavelengths of light or radiant energy to different locations on one or more arrays 712 and 713 of hybrid pixels. The array 712 may include, for example, hybrid pixels, and the array 713 may also include, for example, hybrid pixels. The global meta-lens 711 may focus wavelengths from, for example, between about 0.4 µm to about 1 µm to one or more different locations on the array 712, and may focus wavelengths from, for example, between about 8 µm and about 12 µm to one or more locations on the array 713. Although the arrays 712 and 713 are depicted as being two separate arrays, it should be understood that the arrays 712 and 713 may in some embodiments be a single array.

Figure 7C:
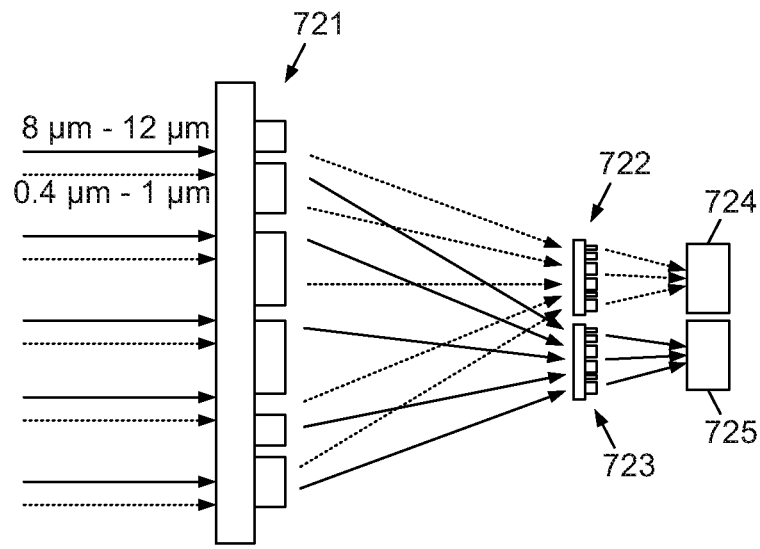

FIG. 7C depicts another example embodiment of optics that may be used with the hybrid pixels disclosed herein. The optics may include a global lens 721 that focuses different wavelengths of visible light and infrared energy to one or more different microlenses 722 and 723. The metasurface microlenses 722 and 723, in turn, may focus the different wavelengths of visible light and infrared energy to one or more different arrays 724 and 725. For example, the microlens 722 may focus wavelengths from between about 8 µm and about 12 µm to one or more locations on an array 724 that may contain one or more hybrid pixels. Similarly, the microlens 723 may focus wavelengths from between about 0.4 µm to about 1 µm to one or more different locations on an array 725 that may contain hybrid pixels. Although the arrays 724 and 725 are depicted as being two separate arrays, it should be understood that the arrays 724 and 725 may in some embodiments be a single array.

Figure 7D:
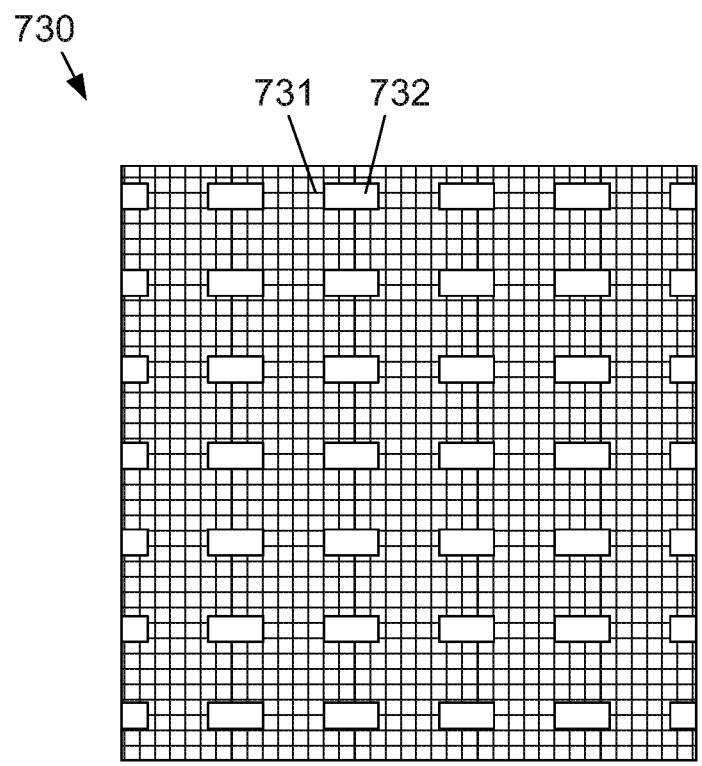

FIG. 7D depicts an example embodiment of a layout of an array 730 that contains hybrid pixels 731 in which the resistive microbolometers 732 may be shared with shared with two or more photodiodes. Other layout arrangements are possible.

Figure 8:
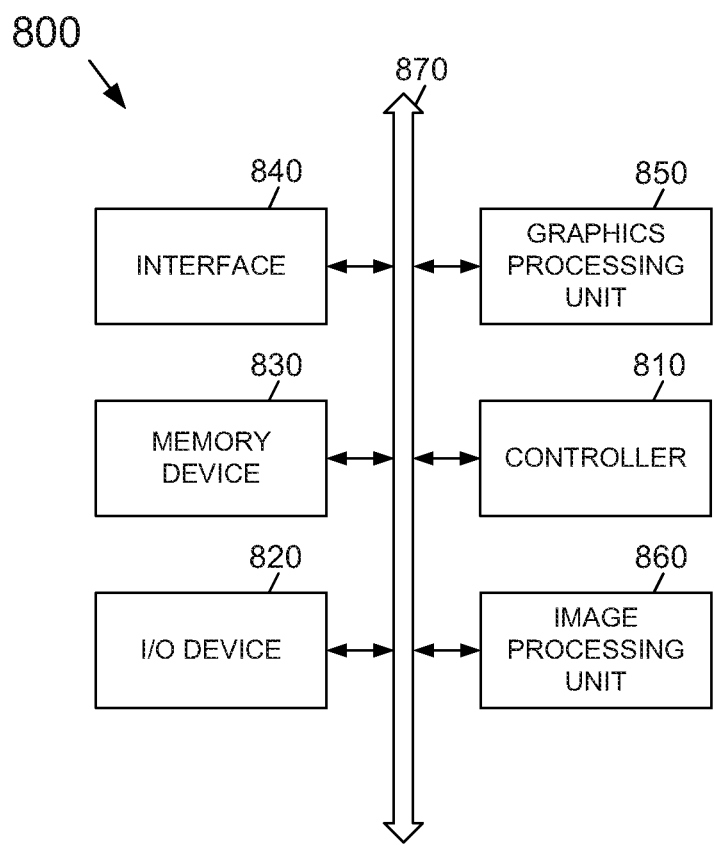
FIG. 8 depicts an electronic device that includes an image processing unit that includes a hybrid pixel according to the subject matter disclosed herein.

FIG. 8 depicts an electronic device 800 that includes an image processing unit that includes a hybrid pixel according to the subject matter disclosed herein. Electronic device 800 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 800 may also be part of, but not limited to, an ADAS, a mobile-device imaging system, an industrial imaging system, robotics, etc. The electronic device 800 may include a controller 810, an input/output device 820 such as, but not limited to, a keypad, a keyboard, a display, a touch-screen display, a camera, and/or an image sensor, a memory 830, an interface 840, a GPU 850, and an imaging processing unit 860 that are coupled to each other through a bus 870. The controller 810 may include, for example, at least one microprocessor, at least one digital signal processor, at least one microcontroller, or the like. The memory 830 may be configured to store a command code to be used by the controller 810 or a user data.

Electronic device 800 and the various system components of electronic device 800 may include the image processing unit 860, which includes a hybrid pixel according to the subject matter disclosed herein. The interface 840 may be configured to include a wireless interface that is configured to transmit data to or receive data from a wireless communication network using a RF signal. The wireless interface 840 may include, for example, an antenna, a wireless transceiver and so on. The electronic system 800 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A pixel for an image sensor, comprising:
   a resistive microbolometer sensor portion that outputs a first signal to a first floating diffusion of the pixel, the first signal corresponding to an infrared (IR) image sensed by the resistive microbolometer sensor portion;
   a visible image sensor portion that outputs a second signal to the first floating diffusion, the second signal corresponding to a visible image sensed by the visible image sensor portion; and
   an output path from the first floating diffusion that is shared by the resistive microbolometer sensor portion and the visible image sensor portion, the output path being controlled to selectively output the first signal, the second signal, or a signal corresponding to a fused image based on the IR image and the visible image.

2. The pixel of claim 1, wherein the resistive microbolometer sensor portion uses no DC bias current.

3. The pixel of claim 2, wherein the visible image sensor portion comprises a photodiode.

4. The pixel of claim 1, wherein the pixel comprises one pixel of an array of pixels.

5. The pixel of claim 4, wherein the array of pixels comprises one or more additional pixels, at least one additional pixel comprising:
   a resistive microbolometer sensor portion that outputs a third signal to a second floating diffusion of the additional pixel, the third signal corresponding to an IR image sensed by the resistive microbolometer sensor portion of the additional pixel;
   a visible image sensor portion that outputs a fourth signal to the second floating diffusion, the fourth signal corresponding to a visible image sensed by the visible image sensor portion of the additional pixel; and
   an output path from the second floating that is shared by the resistive microbolometer sensor portion and the visible image sensor portion of the additional pixel, the output path being controlled to selectively output the third signal, the fourth signal, or a signal corresponding to a fused image based on the IR image and the visible image of the additional pixel.

6. The pixel of claim 1, further comprising a visible image sensor portion of an additional pixel that outputs a third signal to the first floating diffusion, the third signal corresponding to a visible image sensed by the visible image sensor portion of the additional pixel,
   wherein the output path from the first floating diffusion is further shared with a visible image sensor portion of the additional pixel, and
   wherein the output path is further controlled to selectively output the first signal, the second signal, the signal corresponding to the fused image based on the IR image and the visible image, or the third signal.

7. The pixel of claim 1, further comprising a visible image sensor portion of three additional pixels, each of the three additional pixels comprising a visible image sensor portion that respectively output a signal to the first floating diffusion based on a visible image sensed by the visible image sensor portion,
   wherein the output path from the first floating diffusion is further shared with the respective visible image sensor portions of the three additional pixels, and
   wherein the output path is further controlled to selectively output the first signal, the second signal, the signal corresponding to the fused image based on the IR image and the visible image of the pixel, or a selected signal based on the visible image sensed by the visible image sensor portion of one of the three additional pixels.

8. The pixel of claim 1, further comprising a visible image sensor portion of seven additional pixels, each of the seven additional pixels comprising a visible image sensor portion that respectively output a signal to the first floating diffusion based on a visible image sensed by the visible image sensor portion,
   wherein the output path from the first floating diffusion is further shared with the visible image sensor portion of the seven additional pixels, and
   wherein the output path is further controlled to selectively output the first signal, the second signal, the signal corresponding to the fused image based on the IR image and the visible image of the pixel, or a selected signal based on the visible image sensed by the visible image sensor portion of one of the seven additional pixels.

9. The pixel of claim 1, wherein a resistance of the resistive microbolometer sensor portion varies based on an amount of IR energy absorbed by the resistive microbolometer sensor portion.

10. The pixel of claim 9, wherein the resistive microbolometer sensor portion senses a near infrared image.

11. The pixel of claim 9, wherein the resistive microbolometer sensor portion senses a longwave infrared image.

12. An image sensor, comprising:
    an array of pixels, at least one first pixel comprising:

a resistive microbolometer sensor portion that outputs a first signal to a first floating diffusion, the first signal corresponding to an infrared (IR) image sensed by the resistive microbolometer sensor portion; and a visible image sensor portion that outputs a second signal to the first floating diffusion, the second signal corresponding to a visible image sensed by the visible image sensor portion of the first pixel;

a second pixel comprising a visible image sensor portion that outputs a third signal to the first floating diffusion, the third signal corresponding to a visible image sensed by the visible image sensor portion of the second pixel; and an output path from the first floating diffusion that is shared by the resistive microbolometer sensor portion, the visible image sensor portion of the first pixel, and the visible image sensor portion of the second pixel, the output path being controlled to selectively output the first signal, the second signal, a signal corresponding to a fused image based on the IR image and the visible image of the first pixel, or the third signal.

13. The image sensor of claim 12, wherein the resistive microbolometer sensor portion uses no DC bias current.

14. The image sensor of claim 12, further comprising a visible image sensor portion of a third pixel that outputs a fourth signal to the first floating diffusion, the fourth signal corresponding to a visible image sensed by the visible image sensor portion of the third pixel,
wherein the output path from the first floating diffusion is further shared by the visible image sensor portion of the third pixel, and
wherein the output path is further controlled to selectively output the first signal, the second signal, the signal corresponding to the fused image based on the IR image and the visible image of the first pixel, the third signal or the fourth signal.

15. The image sensor of claim 12, further comprising a visible image sensor portion of two additional pixels, each of the two additional pixels comprising a visible image sensor portion that respectively outputs a signal to the first floating diffusion based on a visible image sensed by the visible image sensor portion,
wherein the output path from the first floating diffusion is further shared with the visible image sensor portions of the two additional pixels, and
wherein the output path is further controlled to selectively output the first signal, the second signal, the signal corresponding to the fused image based on the IR image and the visible image of the pixel, or a selected signal based on the visible image sensed by the visible image sensor portion of one of the two additional pixels.

16. The image sensor of claim 12, further comprising a visible image sensor portion of six additional pixels, each of the six additional pixels comprising a visible image sensor portion that respectively outputs to the first floating diffusion based on a visible image sensed by the visible image sensor portion,
wherein the output path from the first floating diffusion is further shared with the visible image sensor portions of the six additional pixels, and
wherein the output path is further controlled to selectively output the first signal, the second signal, the signal corresponding to the fused image based on the IR image and the visible image of the pixel, or a selected signal based on the visible image sensed by the visible image sensor portion of one of the six additional pixels.

17. A pixel for an image sensor, comprising:
a first resistive microbolometer sensor portion that outputs a first signal to a first floating diffusion of the pixel, the first signal corresponding to an infrared (IR) image sensed by the first resistive microbolometer sensor portion;

a first visible image sensor portion that outputs a second signal to the first floating diffusion of the pixel, the second signal corresponding to a visible image sensed by the first visible image sensor portion, and the first visible image sensor portion comprising a photodiode; and an output path from the first floating diffusion of the pixel that is shared by the first resistive microbolometer sensor portion and the first visible image sensor portion, the output path being controlled to selectively output the first signal, the second signal, or a fused image based on the IR image and the visible image of the pixel.

18. The pixel of claim 17, wherein the pixel comprises one pixel of an array of pixels.

19. The pixel of claim 18, wherein the array of pixels comprises one or more additional pixels, at least one additional pixel comprising:
a second resistive microbolometer sensor portion that outputs a third signal to a second floating diffusion of the additional pixel, the third signal corresponding to an IR image sensed by the second resistive microbolometer sensor portion;

a second visible image sensor portion that outputs a fourth signal to the second floating diffusion, the fourth signal corresponding to a visible image sensed by the second visible image sensor portion; and a second output path from the second floating diffusion that is shared by the second resistive microbolometer sensor portion and the second visible image sensor portion, the second output path being controlled to selectively output the third signal, a fused image based on the IR image and the visible image of the additional pixel, or the second signal.

20. The pixel of claim 17, wherein the output path from the first floating diffusion is shared with at least one additional pixel.

* * * * *